(12) United States Patent
Sakai

(10) Patent No.: US 10,078,212 B1
(45) Date of Patent: Sep. 18, 2018

(54) PIXEL REGION INCLUDING A REFLECTIVE LAYER EXTENDING OVER A THIN FILM TRANSISTOR

(71) Applicant: AMAZON TECHNOLOGIES, INC., Seattle, WA (US)

(72) Inventor: Toru Sakai, Waalre (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 55 days.

(21) Appl. No.: 15/080,264

(22) Filed: Mar. 24, 2016

(51) Int. Cl.
  *G02B 26/00* (2006.01)
  *G02B 26/08* (2006.01)
  *G02F 1/29* (2006.01)
  *H01L 27/12* (2006.01)

(52) U.S. Cl.
  CPC ........ *G02B 26/005* (2013.01); *H01L 27/1248* (2013.01); *H01L 27/1262* (2013.01)

(58) Field of Classification Search
  CPC ...... G02B 26/005; G02B 5/201; G02B 26/02; G02B 2207/115; G02B 26/004; G03F 7/0005; G03F 7/0007; G03F 7/16; G03F 7/162; G03F 7/2002; G03F 7/32; G03F 7/40

USPC ................ 359/237, 242, 265–267, 270–273, 359/290–292, 295, 296, 298, 315, 321, 359/322
  See application file for complete search history.

(56) References Cited

U.S. PATENT DOCUMENTS

| | | | |
|---|---|---|---|
| 2011/0220902 A1* | 9/2011 | Lee, II | G02F 1/133555 257/59 |
| 2012/0008191 A1* | 1/2012 | Lim | G02F 1/167 359/296 |
| 2017/0276928 A1* | 9/2017 | Sakai | G02B 5/201 |

* cited by examiner

*Primary Examiner* — Brandi Thomas
(74) *Attorney, Agent, or Firm* — Brinks Gilson & Lione

(57) ABSTRACT

A display device, such as an electrowetting display device, includes a first support plate and an opposing second support plate. A thin film transistor (TFT) structure on the first support plate is communicatively coupled with a pixel within a pixel region between the first support plate and the second support plate. The TFT structure includes an organic layer disposed over a silicon semiconductor layer and a reflective layer disposed on the organic layer. The reflective layer extends over the organic layer to overlie the silicon semiconductor layer.

20 Claims, 6 Drawing Sheets

PIXEL REGION INCLUDING A REFLECTIVE LAYER EXTENDING OVER A THIN FILM TRANSISTOR

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the type and the purpose of the associated electronic device. The appearance and the quality of a display may affect a user's experience with the electronic device and the content presented thereon. Accordingly, enhancing user experience and satisfaction continues to be a priority.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1:
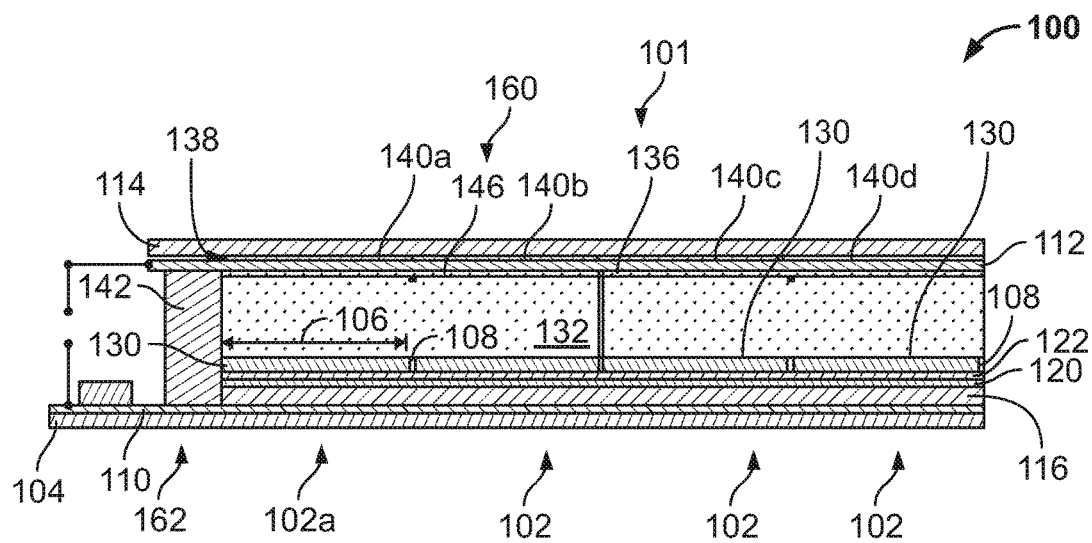
FIG. 1 is a cross-sectional view of an example electrowetting display device, according to various embodiments.

In embodiments described herein, an electrowetting display device includes a plurality of pixel walls formed over a first or bottom support plate. The plurality of pixel walls are associated with an electrowetting pixel within the electrowetting pixel region between the bottom support plate and the top support plate. A thin film transistor (TFT) structure is formed over the bottom support plate and communicatively coupled with the electrowetting pixel. The TFT Structure is configured to transmit operation control signals to the associated electrowetting pixel to activate or deactivate the electrowetting pixel. The TFT structure is positioned under a first pixel wall of the plurality of pixel walls in certain embodiments. The TFT structure includes an organic layer and a reflective layer formed or disposed on the organic layer between the organic layer and the plurality of pixel walls. The reflective layer extends over the organic layer along a length of the TFT structure to overlie or cover a length of a silicon semiconductor layer of the TFT structure. In a particular embodiment, a first pixel wall of the plurality of pixel walls is disposed over a portion of the reflective layer and directly above the silicon semiconductor layer. In certain embodiments, a color filter layer is formed on or coupled to an inner surface of a second or top support plate facing within the electrowetting pixel region. The color filter layer is positioned over the plurality of pixel walls, and includes a color filter positioned directly over the electrowetting pixel and a black matrix material forming a border around at least a portion of the color filter. The black matrix material, e.g., a black matrix segment or member, is positioned directly over the plurality of pixel walls, e.g., the first pixel wall, associated with the electrowetting pixel.

In many electrowetting display devices, a thin film transistor (TFT) structure includes a silicon semiconductor layer, which is highly photosensitive. When ambient light passes through the display device, stray light may pass through the transparent pixel wall into the TFT structure and impinge on the silicon semiconductor layer. When this occurs, the TFT structure becomes conductive due to the photosensitivity of the silicon semiconductor layer. As a result, the TFT structure no longer acts as a reliable switch to activate or deactivate an associated pixel and leakage current from the TFT structure may cause undesirable crosstalk between adjacent pixels, particularly under bright lighting conditions and/or during low frequency driving situations. More specifically, when the TFT structure is operating effectively as a switch, at a positive gate voltage, e.g., a gate voltage of 20 volts, the TFT structure will activate the associated pixel. Conversely, at a negative gate voltage, e.g., a gate voltage of −20 volts, the current through the TFT structure is essentially zero and the TFT structure will deactivate the associated pixel preventing transmission of signals from an electrode layer, i.e., a gate electrode layer, of the TFT structure to the associated pixel. However, as the TFT structure becomes conductive as a result of light leakage into the TFT structure, the TFT structure no longer acts as an effective switch to deactivate the associated pixel and prevent current flow to the associated pixel. Generally, leakage current refers to a small amount of current that flows or leaks through a transistor, e.g., a TFT, when the transistor is turned off. In an ideal transistor, the leakage current is zero, but in practice, leakage current has a finite value. For example, leakage current causes the voltage in the pixel capacitor to either drop or increase between each frame refresh, and, thus, changes the pixel brightness. Leakage current also affects the fineness of the display's grayscale. With a low leakage current, finer levels of grayscale can be achieved.

In an attempt to limit or prevent ambient light from impinging on the TFT structure, a black matrix material is deposited on an inner surface of a top support plate and positioned directly over the transparent pixel wall formed over the bottom support plate to act as a light shield. However, for the black matrix material to act as an effective light shield, the black matrix material must extend into adjacent pixels separated by the pixel wall. For example, for a pixel having a width of 60 micrometers and a height of 120 micrometers, to prevent an ambient light ray propagating through the top support plate at a critical angle, θ, from impinging on the TFT structure, a width of the black pixel material should be greater than 40 micrometers, extending 10-15 micrometers into each adjacent pixel on each side of the pixel wall. As a result, the open area of the pixel may be greatly reduced by up to 50%, leading to a negative impact on the performance of the display device and rendering this solution unfeasible. In order to minimize a width of the black matrix material, a light shield structure as described herein is positioned in the TFT structure backplane of the display device to overlie or cover the TFT structure and, more specifically, the silicon semiconductor layer in the TFT structure, and prevent or limit exposure of the TFT structure to stray ambient light entering the display device.

In electrowetting display devices described herein, the TFT structure includes the reflective layer positioned or disposed over the organic layer to reflect light entering the electrowetting display device to prevent or limit the light from impinging on the electric components, e.g., the TFT structure, positioned under the transparent pixel walls.

In certain embodiments, a pixel region may include a pixel or a pixel having two or more sub-pixels of a display device. Such pixels or sub-pixels may be the smallest light transmissive, reflective or transflective unit of a display that is individually operable to directly control an amount of light transmission through or reflection from the pixel region. For example, in some embodiments, a pixel may include a red sub-pixel, a green sub-pixel, a blue sub-pixel, and a white sub-pixel for RGBW displays. In other embodiments, a pixel may be a smallest component, e.g., the pixel does not include any sub-pixels.

In various embodiments described herein, electronic devices include electrowetting displays for presenting content. In some examples, the electronic devices may include one or more components associated with the electrowetting display, such as a touch sensor component layered atop the electrowetting display for detecting touch inputs, a front light and/or a back light component for lighting the electrowetting display, and/or a cover layer component, which may include anti-glare properties, anti-reflective properties, anti-fingerprint properties, and/or anti-cracking properties, for example.

In certain embodiments, an electrowetting pixel region includes an electrowetting pixel defined by one or more pixel walls that surround or are otherwise associated with at least a portion of the electrowetting pixel. The pixel walls form a structure that is configured to contain at least a portion of a first fluid, e.g., a liquid such as an opaque oil. Light transmission through the electrowetting pixel is controlled by the application of an electric potential to the electrowetting pixel, which results in a movement of a second fluid, e.g., a liquid such as an electrolyte solution, into the electrowetting pixel, thereby displacing the first fluid within the electrowetting pixel.

When the electrowetting pixel is in an off state (i.e., with no electric potential applied), the first liquid, e.g., the opaque oil, is distributed throughout the electrowetting pixel to substantially cover a display surface area of the electrowetting pixel. The first liquid absorbs light and the electrowetting pixel in this condition appears black in one embodiment. But when the electric potential is applied, the electrowetting pixel is in an on state and the first liquid is displaced to one or more sides of the electrowetting pixel, for example. Light can then enter the electrowetting pixel and impinge upon a surface of a reflective layer, for example, positioned at or near a bottom surface of the electrowetting pixel. The light is then reflected by the reflective layer to reflect out of the electrowetting pixel. If the reflective surfaces reflect only a portion of the light spectrum or if color filters are incorporated into the electrowetting pixel structure, the electrowetting pixel may appear to have color.

A display device, such as an electrowetting display device, may include a transmissive, reflective or transflective display that generally includes an array of pixels (e.g., which may comprise sub-pixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) included in each pixel region. Transistors occupy a relatively small fraction of the area of each pixel region to allow light to efficiently pass through (or reflect from) the pixel.

The array of pixels is sandwiched between two support plates, such as a first, e.g., bottom, support plate and an opposing second, e.g., top, support plate. For example, a bottom support plate in cooperation with a top support plate may contain pixel regions that include an oil, an electrolyte solution and pixel walls between the support plates forming associated pixels within a respective pixel region. The support plates may be made of any suitable material including, without limitation, plastic, glass, quartz, and semiconducting materials, and may be made of a rigid material or a flexible material, for example. The pixel regions include various layers of materials built upon the bottom support plate, e.g., within or under the pixels. One example layer is an amorphous fluoropolymer (AF1600®) with hydrophobic behavior. The pixel walls may be formed on a top surface of the hydrophobic layer. The bottom support plate may be opaque while the top support plate is transparent. Describing a component or material as being "transparent" generally means that the component or the material may transmit a relatively large fraction of the light incident upon it. For example, a transparent material or layer might transmit more than 70% or 80% of the light impinging on its surface, although in other examples a transparent material or structure might transmit a different percentage of incident light. In general, transparent materials or structures need not be perfectly transparent.

Hereinafter, example embodiments include, but are not limited to, reflective electrowetting displays having a clear or transparent top support plate and a bottom support plate, which need not be transparent. In general, "top" and "bottom" may be used to identify opposing support plates of an electrowetting display and do not necessarily refer to a direction referenced to gravity or to a viewing side of the electrowetting display device. In example embodiments, the top support plate is the surface through which pixels of a (reflective) electrowetting display are viewed.

As described above, individual reflective electrowetting pixels may include an electrode layer or gate electrode layer containing or coupled to the drive electronics like TFTs, source lines, and gate lines on the bottom support plate, a reflective layer over the electrode layer, a pixel electrode adjacent to the reflective layer, a barrier layer on the reflective layer, and a hydrophobic layer on the barrier layer. In certain embodiments, the reflective layer itself can act as the pixel electrode. The pixel electrode in principle is close to the liquids in the pixel to minimize power consumption. In one alternative embodiment, a patterned layer of indium tin oxide (ITO) is deposited as the pixel electrode over or under the reflective layer. In another alternative embodiment, the pixel electrode is under the reflective layer. The electrode layer as shown in FIGS. 1, 2, 4, and 5 can be an electrode layer containing at least part of the drive electronics if the reflective layer is used as the electrode or the electrode layer can contain the pixel electrodes in contact with the reflective layer. Pixel walls of each pixel, the hydrophobic layer, and the transparent top support plate at least partially enclose a liquid region within the cavity that contains the first liquid which is electrically non-conductive, e.g., an opaque oil retained in the individual electrowetting pixels by pixel walls, and the second liquid, e.g., an electrolyte solution, that is electrically conductive or polar and may be a water or a salt solution, such as a solution of potassium chloride in water. The second liquid may be transparent, but may be colored, or light-absorbing. The second liquid is immiscible with the first liquid. In general, substances are "immiscible" with one another if the substances do not substantially form a solution, although in a particular embodiment the second liquid might not be perfectly immiscible with the first liquid. In general, an "opaque" liquid is a liquid that appears black to an observer. For example, an opaque liquid strongly absorbs a broad spectrum of wavelengths (e.g., including those of red, green and blue light) in the visible region of electromagnetic radiation appearing black. However, in certain embodiments an opaque liquid may absorb a relatively narrower spectrum of wavelengths in the visible region of electromagnetic radiation and may not appear perfectly black.

In some embodiments, the opaque liquid is a nonpolar electrowetting oil. In certain embodiments, the first liquid may absorb at least a portion of the visible light spectrum. The first liquid may be transmissive for a portion of the visible light spectrum, forming a color filter. For this purpose, the first liquid may be colored by addition of pigment particles or a dye. Alternatively, the first liquid may be black, for example by absorbing substantially all portions of the visible light spectrum, or reflecting. A reflective first liquid may reflect the entire visible light spectrum, making the layer appear white, or a portion of the entire visible light spectrum, making the layer have a color. In example embodiments, the first liquid is black and, therefore, absorbs substantially all portions of an optical light spectrum.

Spacers and edge seals mechanically couple the first support plate with the overlying, opposing second support plate, forming a separation between the first support plate and the second support plate, and contributing to the mechanical integrity of the electrowetting display device. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media. Edge seals, for example, disposed along a periphery of an array of electrowetting pixels, may contribute to retaining liquids (e.g., the first liquid and the second liquid) between the first support plate and the overlying second support plate.

In some embodiments, the electrowetting display device as described herein may be incorporated into a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the electrowetting display device. For example, display software may include code executable by a processor to modulate optical properties of individual pixels of the electrowetting display device based at least in part on electronic signals representative of static image and/or video data. The code may cause the processor to modulate the optical properties of pixels by controlling electrical signals (e.g., voltages, currents, and fields) on, over, and/or in layers of the electrowetting display device.

Figure 2:
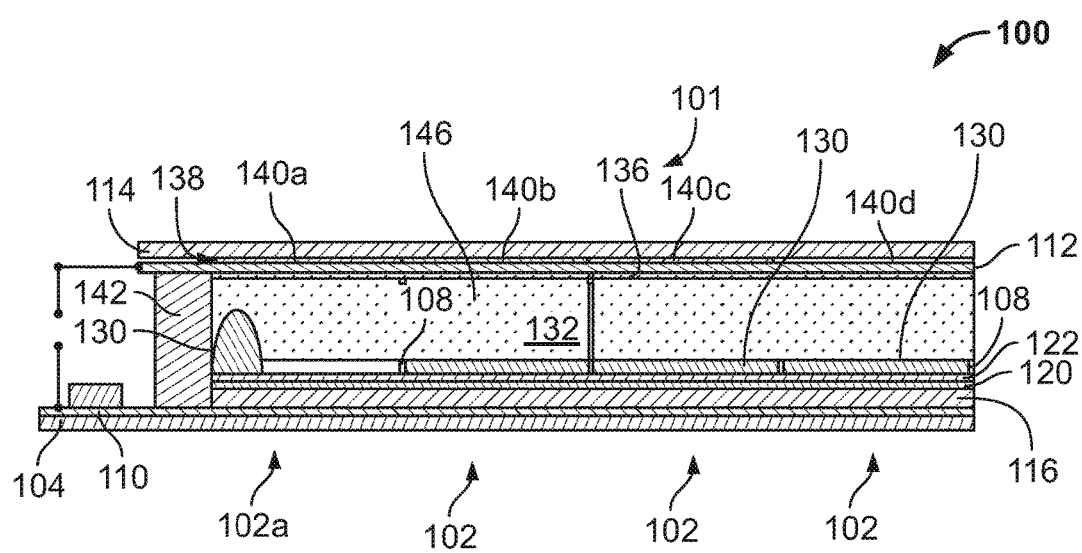
FIG. 2 is a cross-sectional view of the electrowetting display device of FIG. 1 with a first pixel activated, according to various embodiments.
Figure 3:
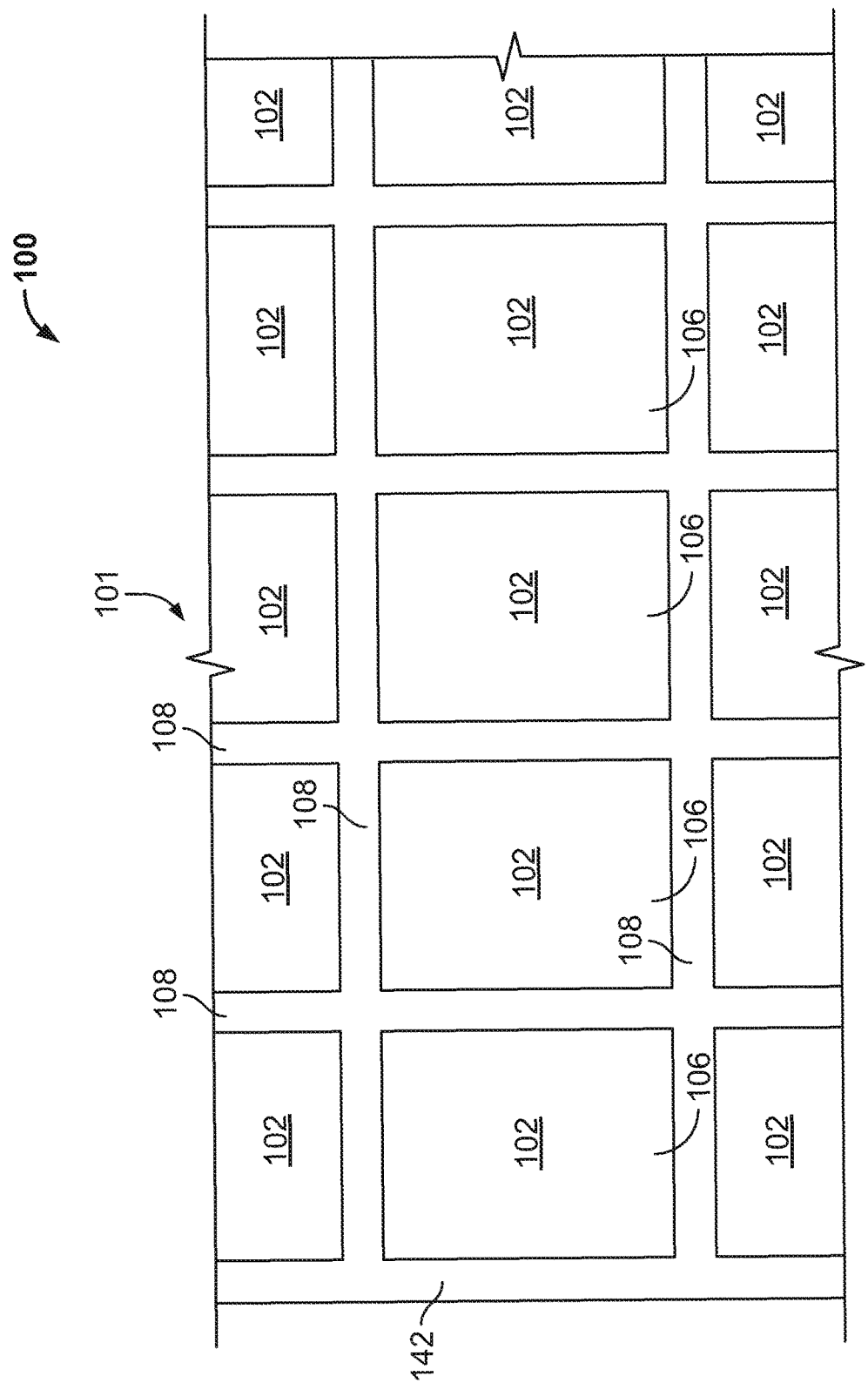
FIG. 3 is a top view of a plurality of electrowetting pixels of an example electrowetting display device, according to various embodiments.

Referring now to the figures, FIG. 1 is a cross-sectional view of a portion of an example reflective electrowetting display device 100 including a pixel grid 101 with several electrowetting pixel regions each including an electrowetting pixel 102. FIG. 2 shows the same cross-sectional view as FIG. 1 in which an electric potential has been applied to one electrowetting pixel 102a causing displacement of a first liquid disposed in electrowetting pixel 102a, as described below. Four complete electrowetting pixels 102 are shown in cross-section in FIGS. 1 and 2. FIG. 3 is a top view of an example reflective electrowetting display device 100 including pixel grid 101 having a plurality of electrowetting pixels 102 formed over a first or bottom support plate 104 (shown in FIGS. 1 and 2). As shown in FIG. 3, each electrowetting pixel 102 defines a display surface area 106. More specifically, in this embodiment, display surface area 106 is defined by pixel walls 108, as described below, having a first dimension, such as a width, between opposing lateral pixel walls 108, and a second dimension, such as a length, between the remaining opposing pixel walls 108. Electrowetting display device 100 may include any number (usually a very large number, such as thousands or millions) of electrowetting pixels 102.

Referring further to FIGS. 1 and 2, a TFT structure 110 includes an electrode layer 111, i.e., a gate electrode layer, having a plurality of pixel electrodes is formed on bottom support plate 104 and between electrowetting pixels 102 and bottom support plate 104. Electrode layer 111 and/or the one or more pixel electrodes are operatively coupled to a second or common electrode 112 positioned under a second or top support plate 114 for creating, in conjunction with common electrode 112, a voltage differential between electrode layer 111 and common electrode 112 to cause displacement of the first liquid, e.g., an oil, within the associated electrowetting pixel 102. These example embodiments are not limiting with respect to the location of the first electrode and the second electrode, and claimed subject matter is not limited in this respect. In particular embodiments, one or more additional layers may be positioned between electrode layer 111 and bottom support plate 104, in which thin film transistors (TFTs), gates, and/or source lines are located, for example. In these embodiments, electrode layer 111 may not be formed directly on bottom support plate 104. In various embodiments, electrode layer 111 forms part of TFT structure 110, which can be switched to either select (activate) or deselect (deactivate) corresponding electrowetting pixel 102 using active matrix addressing, for example. A TFT structure is a particular type of field-effect transistor that includes thin films of an active semiconductor layer as well as a dielectric layer and metallic contacts over a supporting (but non-conducting) substrate, which may be glass or any suitable transparent or non-transparent material, for example.

In example embodiments, TFT structure 110 includes a reflective layer 116 positioned adjacent, e.g., on, or over electrode layer 111, as shown in FIGS. 1 and 2, for example. In particular embodiments, one or more additional layers may be positioned between reflective layer 116 and electrode layer 111. In example embodiments, such as shown in and described in more detail with reference to FIGS. 4 and 5, an organic layer may be positioned between electrode layer 111 and at least a portion of reflective layer 116. In the example embodiments, a portion of reflective layer 116 is formed or disposed on, e.g., deposited on, the organic layer and extends over the TFT structure to prevent or limit light from impinging on the TFT structure and/or components of the TFT structure, e.g., a silicon semiconductor layer of the TFT structure. In these embodiments, reflective layer 116 may not be formed directly on electrode layer 111. In an alternative embodiment, reflective layer 116 is positioned under a transparent electrode layer. In this alternative embodiment, reflective layer 116 is positioned between the transparent electrode layer 111 and bottom support plate 104. Reflective layer 116 may reflect light within the entire visible spectrum, making the layer appear relatively bright, or reflect a portion of light within the visible spectrum, making the layer have a color. In this embodiment, reflective layer 116 is positioned within the pixel region, e.g., within or under each electrowetting pixel 102, to provide specular reflection.

In example embodiments, reflective layer 116 is positioned on or over electrode layer 111 within electrowetting pixel 102 or, alternatively, on or over electrode layer 111 and under electrowetting pixel 102. In certain embodiments, reflective layer 116 is formed or made of any suitable materials including, for example, a metal (90%, 95% or greater than 95% metal), an alloy, a doped metal, or a dielectric reflective material. Suitable metal materials for reflective layer 116 include, without limitation, aluminum, silver, gold, copper, nickel, platinum, rhodium, lanthanum, and/or silicon nickel. Suitable alloy materials for reflective layer 116 include, without limitation, aluminum with copper or aluminum with nickel. In further alternative embodiments, reflective layer 116 is made of any suitable material providing a desired specular reflectance. In alternative embodiments, reflective layer includes a suitable diffuse reflective material deposited on or over electrode layer 111. In this alternative embodiment, any suitable diffuse reflective material, such as titanium dioxide ($TiO_2$), providing a desired diffuse reflectance may be used.

Electrowetting pixels 102 may have specific and/or additional structural features. Additionally or alternatively, reflective layer 116 may have structural features, for example, one or more relatively thinner areas and/or one or more relatively thicker areas within reflective layer 116 to control movement of the fluids. Alternatively, reflective layer 116 may be deposited on a structural feature conforming to a shape of the structural feature.

A suitable dielectric barrier layer 120 may at least partially separate electrode layer 111 from a hydrophobic layer 122, such as an amorphous fluoropolymer layer forming a bottom surface of electrowetting pixel 102 in certain embodiments. For example, dielectric barrier layer 120 may be disposed on, e.g., deposited on, reflective layer 116. Dielectric barrier layer 120 may be formed from various materials including one or more organic material layers or a combination of organic and inorganic material layers. A thickness of the insulating dielectric barrier layer 120 may be less than 2 micrometers and may be less than 1 micrometer; for example, the insulating dielectric barrier layer 120 may be 100 nanometers to 800 nanometers in thickness in certain embodiments. In some embodiments, hydrophobic layer 122 is an amorphous fluoropolymer layer including any suitable fluoropolymer(s), such as AF1600® fluoropolymer, produced by DuPont, based in Wilmington, Del. Hydrophobic layer 122 is transparent in the example embodiment. As described above, in certain embodiments, reflective layer 116 can act both as a pixel electrode and a reflective layer.

In the example embodiment, one or more pixel walls 108 form patterned electrowetting pixel grid 101 on hydrophobic layer 122. Pixel walls 108 may include a photoresist material such as, for example, an epoxy-based negative photoresist material SU-8. Patterned electrowetting pixel grid 101 includes a plurality of rows and a plurality of columns that form an array of electrowetting pixels, such as shown in FIG. 3, including a plurality of electrowetting pixels 102 that may have a width and a height in a range of about 50 to 500 micrometers, for example, and, more particularly, in one embodiment, electrowetting pixels 102 have a width of 60 micrometers and a height of 120 micrometers.

A first liquid 130, which may have a thickness (e.g., a height as shown in FIGS. 1 and 2 for example) in a range of about 1 micrometer to 10 micrometers, for example, overlays hydrophobic layer 122. First liquid 130 is partitioned by pixel walls 108 of patterned electrowetting pixel grid 101. A second liquid 132, such as an electrolyte solution, overlays first liquid 130 and, in certain embodiments, at least a portion of pixel walls 108 of patterned electrowetting pixel grid 101. In certain embodiments, as described above, second liquid 132 may be electrically conductive and/or polar. For example, second liquid 132 may be water or a water solution, or a salt solution such as a solution of potassium chloride in water or a mixture of water and ethyl alcohol. In certain embodiments, second liquid 132 is transparent, but may be colored or absorbing. First liquid 130 is electrically non-conductive and may, for example, be an alkane-like hexadecane or (silicone) oil. As described above, second liquid 132 is immiscible with first liquid 130.

As described above, hydrophobic layer 122 is arranged on or over bottom support plate 104 to create an electrowetting surface area. The hydrophobic character of hydrophobic layer 122 causes first liquid 130 to adjoin preferentially to hydrophobic layer 122 because first liquid 130 has a higher wettability with respect to a top surface of hydrophobic layer 122 than second liquid 132 in the absence of a voltage. Wettability relates to the relative affinity of a fluid, e.g., a liquid, for the surface of a solid. Wettability increases with increasing affinity, and it may be measured by the contact angle formed between the fluid and the solid and measured internal to the fluid of interest. For example, such a contact angle may increase from relative non-wettability for a contact angle of more than 90° to complete wettability for a contact angle of 0°, in which case the fluid, e.g., the liquid, tends to form a film on the surface of the solid.

Top support plate 114 covers second liquid 132 and one or more spacers 136 to maintain second liquid 132 over electrowetting pixel grid 101. In one embodiment, spacers 136 are positioned between top support plate 114 and pixel wall 108. In example embodiments, spacer 136 is coupled to and extends from top support plate 114 to contact a contact surface on a first or distal end of one or more corresponding pixel walls 108. In certain embodiments, one or more components or layers may be positioned between top support plate 114 and spacers 136. In this arrangement, a contact surface of spacer 136 contacts a contact surface of corresponding pixel wall 108 to provide a stable contact joint at an interface between pixel wall 108 and spacer 136, providing mechanical strength at the interface that is less sensitive to overflow and/or leakage of first liquid 130 and/or second liquid 132 contained within the pixel regions. In alternative embodiments, spacer 136 does not rest on pixel wall 108 but is substantially aligned with pixel wall 108. This arrangement may allow spacer 136 to come into contact with pixel wall 108 upon a sufficient pressure or force being applied to top support plate 114. Multiple spacers 136 may be interspersed throughout electrowetting pixel grid 101. In certain embodiments, one or more color filter layers 138 including, for example, color filters 140a-140d as shown in FIGS. 1 and 2, may be positioned between second electrode 112 and top support plate 114. A seal 142 extends about a perimeter of electrowetting display device 100 to contain first liquid 130 and second liquid 132 within the fluid region of the cavity. A voltage applied across, among other things, second liquid 132 and electrode layer 111 of individual electrowetting pixel regions controls transmittance or reflectance of the associated electrowetting pixels 102.

Reflective electrowetting display device 100 has a viewing side 160 corresponding to top support plate 114 through which an image formed by reflective electrowetting display device 100 may be viewed, and an opposing rear side 162 corresponding to bottom support plate 104 as shown, for example, in FIGS. 1 and 2. Reflective electrowetting display device 100 may be a segmented display type in which the image is built of segments. The segments may be switched simultaneously or separately. Each segment includes one electrowetting pixel 102 or a number of electrowetting pixels 102 that may be neighboring or distant from one another. Electrowetting pixels 102 included in one segment are switched simultaneously, for example. Electrowetting display device 100 may also be an active matrix driven display type or a passive matrix driven display, for example.

Figure 4:
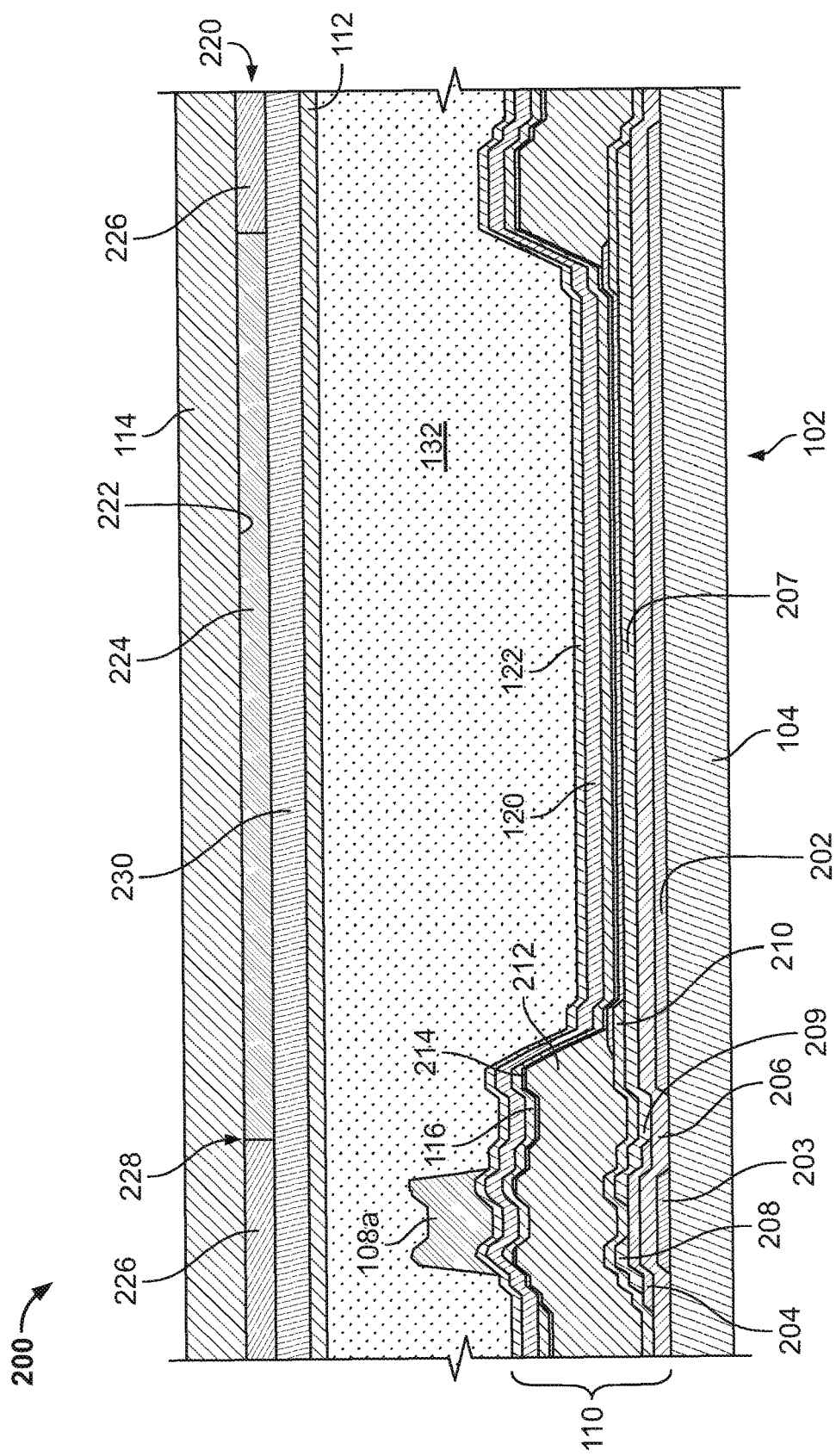
FIG. 4 is a cross-sectional view of a portion of an example electrowetting display device, according to various embodiments.
Figure 5:
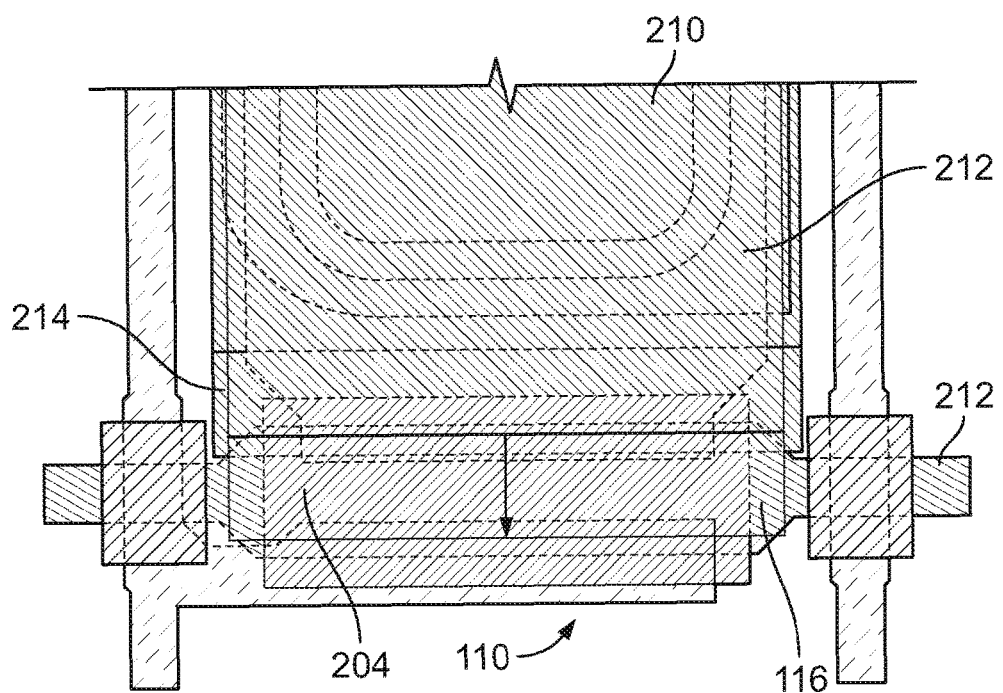
FIG. 5 is a partial top view of a portion of an example electrowetting pixel region, according to various embodiments.

FIG. 4 is a cross-sectional view of a portion of an example display device, such as reflective electrowetting display device 200, with one electrowetting pixel region positioned between bottom support plate 104 and top support plate 114. FIG. 5 is a partial top view of a portion of an example electrowetting pixel region, according to example embodiments. Each pixel region includes an electrowetting pixel 102 formed over bottom support plate 104 to define display surface area 106, as shown in FIG. 3. Electrode layer 111 having a plurality of pixel electrodes is formed on bottom support plate 104 and between electrowetting pixels 102 and bottom support plate 104. Electrode layer 111 and/or the one or more pixel electrodes are operatively coupled to common electrode 112 positioned under top support plate 114 for creating, in conjunction with common electrode 112, a voltage differential between electrode layer 111 and common electrode 112 to cause displacement of first liquid 130, not shown in FIG. 4 for clarity, within associated electrowetting pixel 102.

Referring to FIG. 4, reflective electrowetting display device 200 includes TFT structure 110 disposed or formed overt first support plate 104. TFT structure 110 includes a first metal layer, e.g., an electrode layer or gate electrode layer 202 that includes a gate 203, disposed between pixel wall 108 and bottom support plate 104. As shown in FIG. 4, TFT structure 110 is positioned on or over bottom support plate 104 and directly under or aligned with a first pixel wall 108a shown in FIG. 4 in certain embodiments. TFT structure 110 is coupled in signal communication with associated electrowetting pixel 102 within the pixel region. In the example embodiment, TFT structure 110 is switched to either select (activate) or deselect (deactivate) associated electrowetting pixels 102 using active matrix addressing, for example. TFT structure 110 includes a silicon semiconductor layer 204, e.g., a silicon semiconductor layer including an active amorphous silicon layer, formed on or over, e.g., deposited on, a suitable non-conducting substrate, such as a first passivation layer 206, which may include a silicon nitride layer, for example. A second metal layer 207 is formed or disposed on first passivation layer 206 and at least a portion of silicon semiconductor layer 204. Second metal layer 207 forms a source 208 and a drain 209 of TFT structure 110. In example embodiments, a second passivation layer 210, e.g., a passivation layer comprising silicon nitride, is formed over silicon semiconductor layer 204 and a portion of second metal layer 207.

Referring further to FIG. 4, in example embodiments, an organic layer 212 is formed or disposed on, e.g., deposited on, second passivation layer 209. In the embodiment shown, organic layer 212 is formed on or over second passivation layer 210. Organic layer 212 may include any suitable organic material including, without limitation, a polyacrylate, an epoxy, a polyimide material, and combinations thereof. Reflective layer 116 is formed or disposed on organic layer 212 and extends under first pixel wall 108a to overlie or cover at least silicon semiconductor layer 204 disposed under organic layer 212. As shown in FIG. 4, for example, reflective layer 116 extends over organic layer 212 to substantially overlie or cover silicon semiconductor layer 204. Reflective layer 116 may include any suitable combination of materials, as set forth above. In a particular embodiment, reflective layer 116 includes multiple layers of materials. For example, reflective layer 116 may include a first layer including molybdenum and a second layer including aluminum. In a particular embodiment, TFT structure 110, e.g., silicon semiconductor layer 204, has a length of 3.0 micrometers to 20.0 micrometers and reflective layer 116 extends over at least 100% of the length of silicon semiconductor layer 204 and, more particularly, at least 140% of the length of silicon semiconductor layer 204 to properly act as a light shield. In example embodiments, the length of reflective layer 116 depends at least in part on a thickness of organic layer 212. For example, as organic layer 212 is made thicker, a critical incident angle increases. As a result, a length of reflective layer 116 is increased to prevent or limit light at a critical incident angle from impinging on TFT structure 110. In certain embodiments, for an organic layer 212 having a dielectric constant about 3.0, organic layer 212 has a thickness of 1.0 micrometer to 3.0 micrometers, and, more particularly, 2.0 micrometers. For example, with silicon semiconductor layer 204 having a length of 5.0 micrometers and an organic layer has a thickness of 2.0 micrometers, reflective layer 116 extends 2.0 micrometers past an edge of silicon semiconductor layer 204 to prevent incident light at angle of 45° from impinging on silicon semiconductor layer 204. In certain embodiments, one or more layers may be positioned between reflective layer 116 and organic layer 212. For example, an ITO layer 214 may be positioned between at least a portion of reflective layer 116 and organic layer 212. As shown in FIG. 4, dielectric barrier layer 120 may at least partially separate reflective layer 116 from hydrophobic layer 122, such as an amorphous fluoropolymer layer forming a bottom surface of electrowetting pixel 102 in certain embodiments. For example, dielectric barrier layer 120 may be deposited on reflective layer 116. In some embodiments, hydrophobic layer 122 is an amorphous fluoropolymer layer including any suitable fluoropolymer(s), such as AF1600® fluoropolymer, produced by DuPont, based in Wilmington, Del. Hydrophobic layer 122 is transparent in the example embodiment.

In the example embodiment, one or more pixel walls 108 form patterned electrowetting pixel grid 101 on hydrophobic layer 122. Pixel walls 108 may include a photoresist material such as, for example, epoxy-based negative photoresist material SU-8. Patterned electrowetting pixel grid 101 includes a plurality of rows and a plurality of columns that form an array of electrowetting pixels, such as shown in FIG. 3, including a plurality of electrowetting pixels 102 that may have a width and a length in a range of about 50 to 500 micrometers, for example. First liquid 130, e.g., an opaque oil, overlays hydrophobic layer 122. First liquid 130 is partitioned by pixel walls 108. Second liquid 132, e.g., an electrolyte solution, overlays first liquid 130 and pixel walls 108. Referring further to FIG. 4, in a particular embodiment, TFT structure 110 is positioned under and aligned with first pixel wall 108*a* of the plurality of pixel walls associated with pixel 102 of electrowetting pixel grid 101, with reflective layer 116 positioned between organic layer 212 and first pixel wall 108*a*. More specifically, first pixel wall 108*a* is positioned over a portion of reflective layer 116 covering organic layer 212.

Referring further to FIG. 4, a color filter layer 220 is formed on, e.g., deposited on, an inner surface 222 of top support plate 114 using a suitable method. Color filter layer 220 includes a plurality of color filters, collectively referred to as color filters 224. For example, in example embodiments, color filter layer 220 includes a red color filter, a green color filter, a blue color filter, and a white or transparent color filter positioned between second electrode 112 and top support plate 114. Exemplary color filter 224 is shown as a blue color filter in FIG. 4; however, color filter 224 may be a red color filter, a green color filter, or a white or transparent color filter. Each color filter 224 is positioned within a respective pixel region and directly over or aligned with a respective electrowetting pixel 102 within the respective pixel region. Each color filter 224 may be configured to be substantially transparent to particular ranges of wavelengths of light, while absorbing others. For example, a red color filter may be transparent to red light having wavelengths ranging from 620 nanometers (nm) to 750 nm, while absorbing light having other wavelengths. A green color filter may be transparent to green light having wavelengths ranging from 495 nm to 570 nm, while absorbing light having other wavelengths. A blue color filter may be transparent to blue light having wavelengths ranging from 450 nm to 495 nm, while absorbing light having other wavelengths. A white or transparent color filter may be transparent to all wavelengths of visible light, namely white light. As used herein, visible light refers to wavelengths of electromagnetic radiation visible to the human eye. Generally, this includes electromagnetic radiation having wavelengths between about 400 nm to about 700 nm.

Color filters 224, therefore, may be utilized to assign each pixel 102 a color, so that when a particular pixel 102 is in an open state, light reflected by that pixel will take on the color of the color filter associated with that pixel 102. In other embodiments, different ranges of light wavelengths may be associated with the red, green, and blue color filters 224. In still other embodiments, color filters 224 may be configured to block or transmit electromagnetic radiation of different wavelengths entirely. For example, electrowetting display device 200 may be configured to generate images using pixels 102 having color filters 224 configured to transmit electromagnetic radiation of the colors cyan, magenta, and yellow. In short, color filters 224 may be developed and utilized within electrowetting display device 200 in accordance with any display color model.

Each pixel 102 is associated with a color filter 240. Colors filters 224 may be constructed with a generally transparent material such as a photoresist material or photo-definable polymer, including electromagnetic radiation filtering materials suspended within the material. Color filters 224 may be formed by the addition of pigments or dyes to a clear photo-definable polymer, for example. The amount of additive depends on system requirements, such as absorbance or transmission specifications. In some cases, polyacrylates are used as photoresist material. General, the organic dyes and pigments used within color filters 224 can have molecular structures containing chromophoric groups generating the color filtering properties. Some examples for chromophoric groups are azo-, anthraquinone-, methine- and phtalocyanine-groups. Color filters 224 may also be formed using a dichromated gelatin doped with a photosynthesizer, dyed polyimides, resins, and the like.

Color filters 224 are configured to overlay each pixel 102 entirely so that the color filters 224 extend from one pixel wall 108 on a first side of pixel 102 to an opposing pixel wall 108 on a second side of pixel 102. In one embodiment, electrowetting display device 200 includes a combination of red, blue, green, and white color filters 224, with one color filter 224 being positioned over each pixel 102. Using color filters 224, each pixel 102 in electrowetting display device 200 can be associated with a particular wavelength of electromagnetic radiation. By controlling which pixels 102 are active within electrowetting display device 200, electrowetting display device 200 can generate color images viewable by a user at viewing side 160. In the example embodiment, color filter layer 220 includes a black matrix material, e.g., one or more black matrix members 226, positioned around at least a portion of each color filter 224 to form a boundary or border around at least a portion of the associated color filter 224.

In example embodiments, the black matrix material is aligned with or positioned directly over one or more pixel walls 108, such as first pixel wall 108*a* shown in FIG. 4, associated with an associated electrowetting pixel 102. As shown in FIG. 4, electrowetting display device 200 includes a black matrix member 226 positioned over first pixel wall 108*a*. More specifically, black matrix member 226 is positioned along an edge 228 of a first color filter, between the first color filter and an adjacent second color filter. Color filters 224 are adjacent when they are next to one another in the display device with no intervening color filter 224 between. Black matrix member 226 is formed between the first filter and the second color filter so that black matrix member 226 runs along a boundary between the adjacent color filters. In a particular embodiment, black matrix member 226 has a width between the first color filter and the second color filter of 3.0 micrometers to 10.0 micrometers.

Referring further to FIG. 4, a plurality of pixel walls 108 is formed over bottom support plate 104. The plurality of pixel walls 108 are associated with a pixel 102 within the pixel region. Each black matrix member 226 is positioned directly over a respective pixel wall 108 of the plurality of pixel walls 108. In this embodiment, TFT structure 110 is positioned under pixel wall 108*a* and between pixel wall 108*a* and bottom support plate 104. An overcoat layer, e.g., a planarization layer 230, is applied over color filter layer 220 to protect the color filter material from electrolyte solution contained within a pixel region between top support plate 114 and electrowetting pixels 102. In certain embodiments, a transparent planarization layer 230 provides a smooth, planar surface on color filter layer 220. An ITO layer is applied or deposited on the overcoat layer to form common electrode 112, as discussed herein. One or more spacers 136 may be coupled to, e.g., formed on, the ITO layer or an outer surface of common electrode 112.

In this example embodiment, common electrode 112 is positioned over, e.g., formed or deposited on, planarization layer 230 and within the pixel region. First liquid 130, e.g., an opaque oil, and second liquid 132, e.g., an electrolyte solution, that is immiscible with first liquid 130 are arranged in the pixel region between bottom support plate 104 and top support plate 114. More specifically, first liquid 130 is contained within each electrowetting pixel 102 and second liquid 132 is contained with the liquid region between common electrode 112 and electrowetting pixels 102, in contact with common electrode 112. On or more spacers 136, not shown in FIG. 4, may be coupled to, e.g., formed on, common electrode 112 within the respective pixel region and extend from common electrode 112 to contact a corresponding pixel wall 108.

In one example embodiment, an electrowetting display device includes a first support plate and an opposing second support plate. An electrowetting pixel region is between the first support plate and the second support plate. A plurality of pixel walls are formed over the first support plate. The plurality of pixel walls forms a perimeter of an electrowetting pixel within the electrowetting pixel region. A thin film transistor (TFT) structure is formed over the first support plate. The TFT structure is communicatively coupled to the electrowetting pixel. The TFT structure includes a first metal layer over the first support plate. The first metal layer includes a gate. A first passivation layer is disposed on the first metal layer. A silicon semiconductor layer is disposed on the first passivation layer and formed over the first metal layer. A second metal layer is disposed on the silicon semiconductor layer. The second metal layer includes a source and a drain. A second passivation layer is disposed on the second metal layer. An organic layer is disposed on the second passivation layer. The organic layer has a thickness greater than 1.0 micrometer. A reflective layer is disposed on the organic layer. The reflective layer extends over the organic layer under a first pixel wall of the plurality of pixel walls to overlie or cover the silicon semiconductor layer. The TFT structure is positioned under the first pixel wall of the plurality of pixel walls in certain embodiments. In a particular embodiment, a color filter layer is coupled to an inner surface of the second support plate within the electrowetting pixel region. The color filter layer is positioned over the plurality of pixel walls. The color filter layer includes a color filter positioned directly over the electrowetting pixel and a black matrix material forming a border around the color filter. The black matrix material is positioned directly over the plurality of pixel walls associated with the electrowetting pixel. In one embodiment, a first pixel wall of the plurality of pixel walls is positioned over a portion of the reflective layer covering the organic layer and the silicon semiconductor layer disposed under the organic layer.

Figure 6:
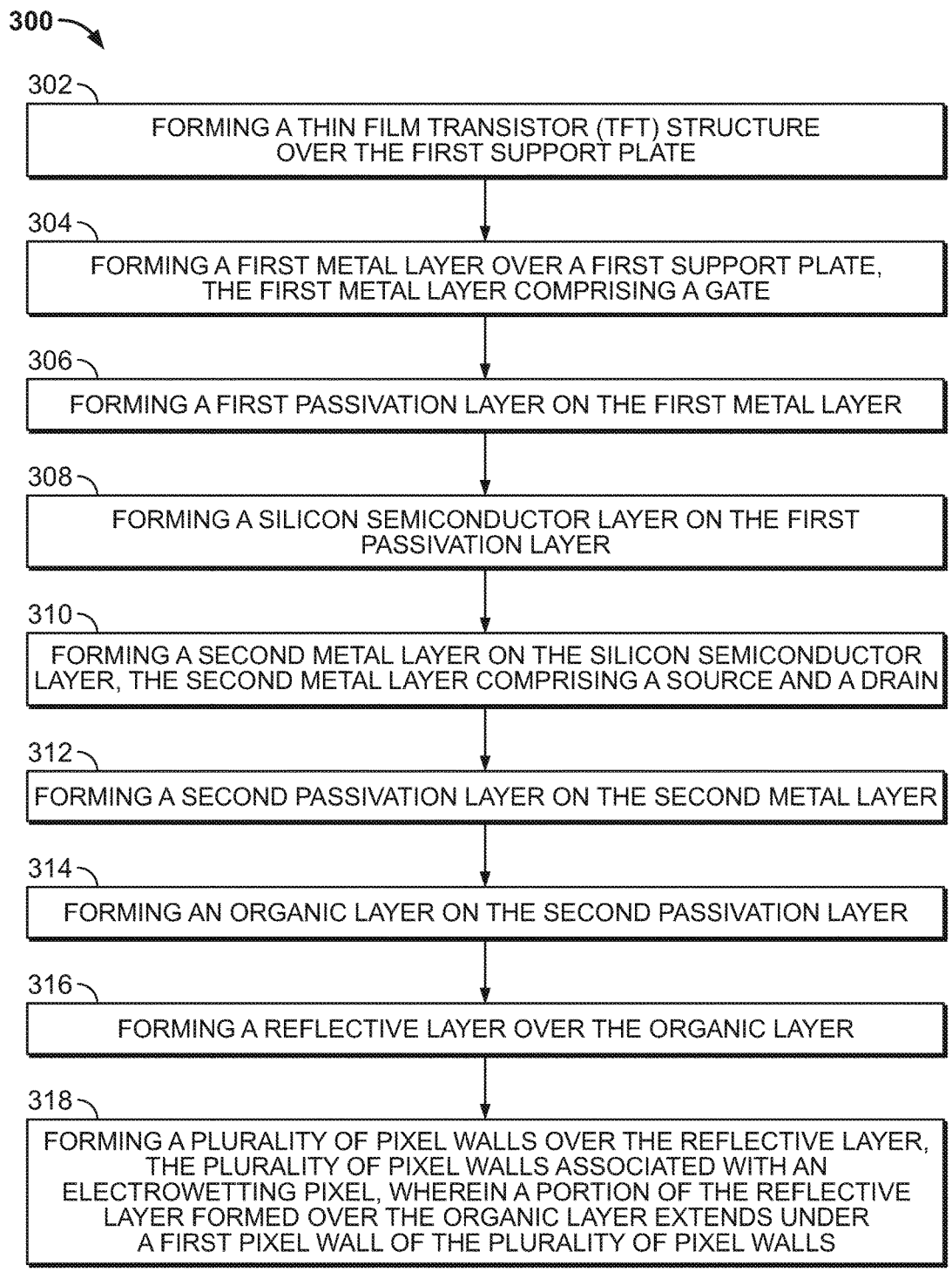
FIG. 6 illustrates an example method for fabricating an example electrowetting display device such as shown in FIGS. 1-5.

In another example embodiment, a display device includes a first support plate and an opposing second support plate. A pixel region is between the first support plate and the second support plate. A plurality of pixel walls are disposed over the first support plate. The plurality of pixel walls forms a perimeter of a pixel within the pixel region. A thin film transistor (TFT) structure is formed on the first support plate. The TFT structure is communicatively coupled with the pixel within the pixel region. The TFT structure includes an n organic layer disposed over a silicon semiconductor layer of the TF structure and a reflective layer disposed on the organic layer. The reflective layer extends over the organic layer to overlie or cover the silicon semiconductor layer. A plurality of pixel walls is formed over a portion of the reflective layer and the reflective layer extends under a first pixel wall of the plurality of pixel walls disposed directly over the silicon semiconductor layer. The pixel walls are associated with the pixel. FIG. 6 is a flow diagram of an example method 300 for fabricating an electrowetting display device, such as electrowetting display device 100 as shown in FIGS. 1-5. Though claimed subject matter is not limited in this respect, method 300 may be performed manually (e.g., by humans) and/or using automated equipment. At block 302, a thin film transistor (TFT) structure is formed over a first support plate. In one embodiment, forming 302 a TFT structure over the first support plate includes forming 304 a first metal layer over the first support plate. The first metal layer includes a gate. A first passivation layer is formed 306 on the first metal layer. A silicon semiconductor layer is formed 308 on the first passivation layer and a second metal layer is formed 310 on the silicon semiconductor layer. The second metal layer includes a source and a drain. A second passivation layer is formed 312 on the second metal layer. An organic layer is formed 314 on the second passivation layer. In an example embodiment, forming 304 an organic layer on the second passivation layer includes depositing a photoresist material having a thickness greater than 1.0 micrometers, e.g., a thickness of 1.0 micrometer to 3.0 micrometers and, more particularly, a thickness of 2.0 micrometers, on the second passivation layer. The photoresist material is patterned to form a patterned photoresist material and the patterned photoresist material is developed to form the organic layer. In this embodiment, the organic layer forms a grid of organic material over the first support plate.

A reflective layer is then formed 316 on the organic layer to extend over the silicon semiconductor layer. More specifically, in one embodiment, the reflective layer is formed on the organic layer to extend the reflective layer over the organic layer to overlie or cover a length of the silicon semiconductor layer within the TFT structure. In the example embodiment, a hole is formed through the second passivation layer to electrically couple the reflective layer to the second metal layer. Forming a reflective layer 316 on the organic layer includes depositing a photoresist material on the organic layer. The photoresist material is patterned to form a patterned photoresist material and the patterned photoresist material is etched to form the reflective layer extending over at least 100% of a length of the TFT structure, e.g., a length of the silicon semiconductor layer, and, more particularly, extending over at least 140% of a length of the TFT structure, e.g., a length of the silicon semiconductor layer. In the example embodiment, a barrier layer is formed on the reflective layer and a hydrophobic layer is formed on the barrier layer, with the plurality of pixel walls formed on the hydrophobic layer.

In a particular embodiment, a thin film transistor (TFT) structure is formed over a support plate having a silicon semiconductor layer. The silicon semiconductor layer has a length between 3.0 micrometers and 20.0 micrometers. An organic layer having a thickness of 1.0 micrometer to 3.0 micrometers is formed on the second passivation layer. In this embodiment, the reflective layer is formed on the organic layer to extend at least 100% and, more particularly, at least 140% of the length of the silicon semiconductor layer.

A plurality of pixel walls associated with an electrowetting pixel is formed 318 over the reflective layer. In one embodiment, the plurality of pixel walls formed over the reflective layer is associated with an electrowetting pixel, wherein a portion of the reflective layer formed over the organic layer extends under a first pixel wall of the plurality of pixel walls to overlie the silicon semiconductor layer. In one embodiment, forming 318 a plurality of pixel walls over the reflective layer comprises forming the plurality of pixel walls directly over the grid formed by the organic layer. Pixel walls are formed 318 by depositing a photoresist material over the first support plate. The photoresist material is then patterned through a mask and developed to form a pixel wall associated with the electrowetting pixel and aligned directly over the TFT structure and the silicon semiconductor layer. In alternative embodiments, these structures may be printed using suitable methods other than photolithography, including, without limitation, direct writing and electron beam lithography (EBL). The pixel walls are fused together and the undeveloped portions of the photoresist material are removed to leave the pixel walls.

In certain embodiments, a suitable barrier layer is formed on or over the reflective layer and a hydrophobic layer, such as an AF 1600® layer, is formed over the barrier layer. A plurality of pixel walls is formed to define a patterned electrowetting pixel grid on hydrophobic layer. In one embodiment, the pixel walls include a photoresist material such as, for example, epoxy-based negative photoresist SU-8. The formed patterned electrowetting pixel grid includes a plurality of rows and a plurality of columns that form an array of electrowetting pixels, such as shown in FIG. 3, including a plurality of electrowetting pixels having a suitable width and length.

In an example embodiment, a first photoresist is deposited over a surface of a support plate, i.e., a top support plate. The first photoresist is transparent to a first color of visible light and capable of absorbing one or more colors of visible light. The first photoresist is patterned through a first mask to cure a first portion of the first photoresist into a first color filter that is transparent to the first color of visible light and absorbing one or more colors of visible light, for example, a second color of visible light. A second photoresist is deposited over the surface of the support plate. The second photoresist is patterned through a second mask to cure a second portion of the second photoresist into a black matrix member forming at least a portion of a border around the first color filter. A planarization layer is formed over the color filter layer and the color stack to form a layer having a smooth, planar surface. A common electrode is then formed on the planarization layer and within the pixel region. In certain embodiments, a spacer is formed on the common electrode. The spacer extends from the common electrode to contact a respective pixel wall. The first support plate is coupled to the second support plate to align the black matrix member directly over the pixel wall and the color filter over the electrowetting pixel. In one embodiment, a first color filter is formed on a surface of a second support plate. The first color filter is transparent to the first color of visible light. A black matrix material grid is formed over the surface of the second support plate. The black matrix material grid includes a plurality of black matrix members forming at least a portion of a border around one or more color filter, e.g., around the first color filter. A plurality of pixel walls formed over the reflective layer is associated with the electrowetting pixel, and a first pixel wall of the plurality of pixel walls is aligned directly over the TFT. In this embodiment, the first support plate is coupled to the second support plate to align a first black matrix member of the plurality of black matrix members directly over the first pixel wall and the first color filter over the electrowetting pixel.

Figure 7:
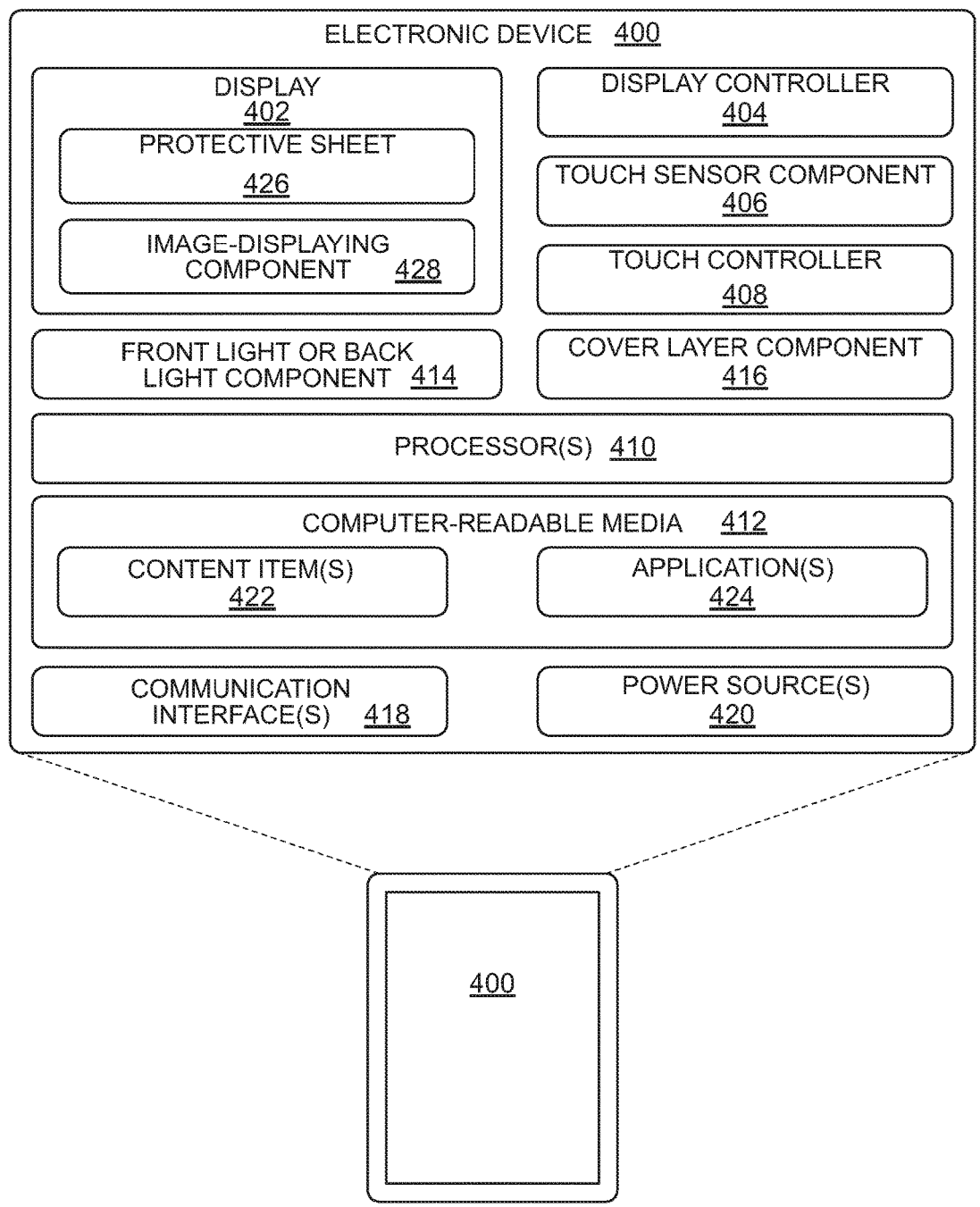
FIG. 7 illustrates an example electronic device that may incorporate an electrowetting display device, according to various embodiments.

FIG. 7 illustrates an example electronic device 400 that may incorporate any of the display devices discussed above. Electronic device 400 may comprise any type of electronic device having a display. For instance, electronic device 400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 400 may be a non-mobile electronic device (e.g., a computer display or a television). In addition, while FIG. 7 illustrates several example components of electronic device 400, it is to be appreciated that electronic device 400 may also include other conventional components, such as an operating system, system busses, input/output components, and the like. Further, in other embodiments, such as in the case of a television or computer monitor, electronic device 400 may only include a subset of the components illustrated.

Regardless of the specific implementation of electronic device 400, electronic device 400 includes a display 402 and a corresponding display controller 404. Display 402 may represent a reflective or transmissive display in some instances or, alternatively, a transflective display (partially transmissive and partially reflective).

In one embodiment, display 402 comprises an electrowetting display that employs an applied voltage to change the surface tension of a liquid in relation to a surface. For example, such an electrowetting display may include the array of pixels 102 illustrated in FIG. 3, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of display 402 are independently activated, display 402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, display 402 may represent a backlit display, examples of which are mentioned above.

In addition to including display 402, FIG. 7 illustrates that some examples of electronic device 400 may include a touch sensor component 406 and a touch controller 408. In some instances, at least one touch sensor component 406 resides with, or is stacked on, display 402 to form a touch-sensitive display. Thus, display 402 may be capable of both accepting user touch input and rendering content in response to or corresponding to the touch input. As several examples, touch sensor component 406 may comprise a capacitive touch sensor, a force sensitive resistance (FSR), an interpolating force sensitive resistance (IFSR) sensor, or any other type of touch sensor. In some instances, touch sensor component 406 is capable of detecting touches as well as determining an amount of pressure or force of these touches.

FIG. 7 further illustrates that electronic device 400 may include one or more processors 410 and one or more computer-readable media 412, as well as a front light component 414 (which may alternatively be a backlight component in the case of a backlit display) for lighting display 402, a cover layer component 416, such as a cover glass or cover sheet, one or more communication interfaces 418 and one or more power sources 420. The communication interfaces 418 may support both wired and wireless connection to various networks, such as cellular networks, radio, WiFi networks, short range networks (e.g., Bluetooth®), and infrared (IR) networks, for example.

Depending on the configuration of electronic device 400, computer-readable media 412 (and other computer-readable media described throughout) is an example of computer storage media and may include volatile and nonvolatile memory. Thus, computer-readable media 412 may include, without limitation, RAM, ROM, EEPROM, flash memory, and/or other memory technology, and/or any other suitable medium that may be used to store computer-readable instructions, programs, applications, media items, and/or data which may be accessed by electronic device 400.

Computer-readable media 412 may be used to store any number of functional components that are executable on processor 410, as well as content items 422 and applications 424. Thus, computer-readable media 412 may include an operating system and a storage database to store one or more content items 422, such as eBooks, audio books, songs, videos, still images, and the like. Computer-readable media 412 of electronic device 400 may also store one or more content presentation applications to render content items on electronic device 400. These content presentation applications may be implemented as various applications 424 depending upon content items 422. For instance, the content presentation application may be an electronic book reader application for rending textual electronic books, an audio player for playing audio books or songs, or a video player for playing video.

In some instances, electronic device 400 may couple to a cover (not illustrated in FIG. 7) to protect display 402 (and other components in the display stack or display assembly) of electronic device 400. In one example, the cover may include a back flap that covers a back portion of electronic device 400 and a front flap that covers display 402 and the other components in the stack. Electronic device 400 and/or the cover may include a sensor (e.g., a Hall effect sensor) to detect whether the cover is open (i.e., if the front flap is not atop display 402 and other components). The sensor may send a signal to front light component 414 if the cover is open and, in response, front light component 414 may illuminate display 402. If the cover is closed, meanwhile, front light component 414 may receive a signal indicating that the cover has closed and, in response, front light component 414 may turn off.

Furthermore, the amount of light emitted by front light component 414 may vary. For instance, upon a user opening the cover, the light from the front light may gradually increase to its full illumination. In some instances, electronic device 400 includes an ambient light sensor (not illustrated in FIG. 7) and the amount of illumination of front light component 414 may be based at least in part on the amount of ambient light detected by the ambient light sensor. For example, front light component 414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 402 may vary depending on whether front light component 414 is on or off, or based on the amount of light provided by front light component 414. For instance, electronic device 400 may implement a larger default font or a greater contrast when the light is off compared to when the light is on. In some embodiments, electronic device 400 maintains, if the light is on, a contrast ratio for display 402 that is within a certain defined percentage of the contrast ratio if the light is off.

As described above, touch sensor component 406 may comprise a capacitive touch sensor that resides atop display 402. In some examples, touch sensor component 406 may be formed on or integrated with cover layer component 416. In other examples, touch sensor component 406 may be a separate component in the stack of the display assembly. Front light component 414 may reside atop or below touch sensor component 406. In some instances, either touch sensor component 406 or front light component 414 is coupled to a top surface of a protective sheet 426 of display 402. As one example, front light component 414 may include a lightguide sheet and a light source (not illustrated in FIG. 7). The lightguide sheet may comprise a substrate (e.g., a transparent thermoplastic such as PMMA or other acrylic), a layer of lacquer and multiple grating elements formed in the layer of lacquer that function to propagate light from the light source towards display 402; thus, illuminating display 402.

Cover layer component 416 may include a transparent substrate or sheet having an outer layer that functions to reduce at least one of glare or reflection of ambient light incident on electronic device 400. In some instances, cover layer component 416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3*h* pencil). Without such scratch resistance, a device may be more easily scratched and a user may perceive the scratches from the light that is dispersed over the top of the reflective display. In some examples, protective sheet 426 may include a similar UV-cured hard coating on the outer surface. Cover layer component 416 may couple to another component or to protective sheet 426 of display 402. Cover layer component 416 may, in some instances, also include a UV filter, a UV-absorbing dye, or the like, for protecting components lower in the stack from UV light incident on electronic device 400. In still other examples, cover layer component 416 may include a sheet of high-strength glass having an antiglare and/or antireflective coating.

Display 402 includes protective sheet 426 overlying an image-displaying component 428. For example, display 402 may be preassembled to have protective sheet 426 as an outer surface on the upper or image-viewing side of display 402. Accordingly, protective sheet 426 may be integral with and may overlay image-displaying component 428. Protective sheet 426 may be optically transparent to enable a user to view, through protective sheet 426, an image presented on image-displaying component 428 of display 402.

In some examples, protective sheet 426 may be a transparent polymer film in the range of 25 to 200 micrometers in thickness. As several examples, protective sheet 426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 426 may include a coating, such as the hard coating described above. For instance, the hard coating may be applied to the outer surface of protective sheet 426 before or after assembly of protective sheet 426 with image-displaying component 428 of display 402. In some examples, the hard coating may include a photoinitiator or other reactive species in its composition, such as for curing the hard coating on protective sheet 426. Furthermore, in some examples, protective sheet 426 may be dyed with a UV-light-absorbing dye, or may be treated with other UV-absorbing treatment. For example, protective sheet 426 may be treated to have a specified UV cutoff such that UV light below a cutoff or threshold wavelength is at least partially absorbed by protective sheet 426, thereby protecting image-displaying component 428 from UV light.

According to some embodiments herein, one or more of the components discussed above may be coupled to display 402 using liquid optically-clear adhesive (LOCA). For example, the light guide portion of front light component 414 may be coupled to display 402 by placing LOCA on the outer or upper surface of protective sheet 426. If the LOCA reaches the corner(s) and/or at least a portion of the perimeter of protective sheet 426, UV-curing may be performed on the LOCA at the corners and/or the portion of the perimeter. Thereafter, the remaining LOCA may be UV-cured and front light component 414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 414. In other embodiments, the LOCA may be placed near a center of protective sheet 426, and pressed outwards towards a perimeter of the top surface of protective sheet 426 by placing front light component 414 on top of the LOCA. The LOCA may then be cured by directing UV light through front light component 414. As discussed above, and as discussed additionally below, various techniques, such as surface treatment of the protective sheet, may be used to prevent discoloration of the LOCA and/or protective sheet 426.

While FIG. 7 illustrates a few example components, electronic device 400 may have additional features or functionality. For example, electronic device 400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 400 may reside remotely from electronic device 400 in some implementations. In these implementations, electronic device 400 may utilize communication interfaces 418 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
a first support plate and an opposing second support plate;
an electrowetting pixel region between the first support plate and the second support plate;
a plurality of pixel walls over the first support plate, the plurality of pixel walls forming a perimeter of an electrowetting pixel within the electrowetting pixel region;
a thin film transistor (TFT) structure over the first support plate, the TFT structure comprising:
a first metal layer over the first support plate, the first metal layer comprising a gate;
a first passivation layer on the first metal layer;
a silicon semiconductor layer on the first passivation layer;
a second metal layer on the silicon semiconductor layer, the second metal layer comprising a source and a drain;
a second passivation layer on the second metal layer;
an organic layer on the second passivation layer, the organic layer having a thickness greater than 1.0 micrometers; and
a reflective layer disposed on the organic layer, the reflective layer extending over the organic layer and under a first pixel wall of the plurality of pixel walls to overlie the silicon semiconductor layer.

2. The electrowetting display device of claim 1, further comprising a color filter layer on the second support plate within the electrowetting pixel region, and positioned over the plurality of pixel walls, the color filter layer comprising:
 a color filter positioned directly over the electrowetting pixel; and
 a black matrix material forming a border around the color filter, the black matrix material positioned directly over the plurality of pixel walls associated with the electrowetting pixel.

3. The electrowetting display device of claim 1, wherein the silicon semiconductor layer has a length of at least 3.0 micrometers and the reflective layer extends over at least 140% of the silicon semiconductor layer.

4. A display device, comprising:
 a first support plate and an opposing second support plate;
 a pixel region between the first support plate and the second support plate;
 a plurality of pixel walls over the first support plate, the plurality of pixel walls forming a perimeter of a pixel within the pixel region; and
 a thin film transistor (TFT) structure on the first support plate, the TFT structure communicatively coupled with the pixel, the TFT structure comprising:
 an organic layer; and
 a reflective layer disposed on the organic layer, the reflective layer extending over the organic layer.

5. The display device of claim 4, wherein the reflective layer extends over the organic layer under a first pixel wall of the plurality of pixel walls.

6. The display device of claim 4, wherein the TFT structure comprises:
 a first metal layer over the first support plate, the first metal layer comprising a gate;
 a first passivation layer on the first metal layer;
 a silicon semiconductor layer on the first passivation layer;
 a second metal layer on the silicon semiconductor layer, the second metal layer comprising a source and a drain; and
 a second passivation layer over the second metal layer, wherein the reflective layer extends over the organic layer to overlie a length of the silicon semiconductor layer.

7. The display device of claim 6, wherein the organic layer has a thickness greater than 1.0 micrometer.

8. The display device of claim 7, wherein the silicon semiconductor layer has a length of 3.0 micrometers to 20.0 micrometers and the reflective layer extends over at least 140% of the silicon semiconductor layer.

9. The display device of claim 4, further comprising a color filter layer on an inner surface of the second support plate, the color filter layer comprising:
 a plurality of color filters, wherein a first color filter of the plurality of color filters is positioned within the pixel region; and
 a black matrix member positioned along an edge of the first color filter between the first color filter and an adjacent second color filter of the plurality of color filters, wherein the black matrix member is positioned directly over a first pixel wall of the plurality of pixel walls.

10. The display device of claim 9, further comprising:
 a planarization layer over the color filter layer;
 a common electrode on the planarization layer and within the pixel region; and
 a first liquid and a second liquid that is immiscible with the first liquid, the first liquid and the second liquid arranged in the pixel region, wherein the TFT structure is coupled to the common electrode for creating, in conjunction with the common electrode, a voltage differential between the TFT structure and the common electrode to cause displacement of the first fluid within the pixel.

11. The display device of claim 4, wherein the reflective layer extends over at least 100% of the silicon semiconductor layer.

12. The display device of claim 4, wherein the reflective layer comprises a first layer comprising molybdenum and a second layer comprising aluminum.

13. An electrowetting display device, comprising:
 a first support plate;
 a first metal layer over the first support plate, the first metal layer comprising a gate;
 a first passivation layer on the first metal layer;
 a silicon semiconductor layer on the first passivation layer;
 a second metal layer on the silicon semiconductor layer, the second metal layer comprising a source and a drain;
 a second passivation layer on the second metal layer;
 an organic layer on the second passivation layer;
 a reflective layer over the organic layer; and
 a plurality of pixel walls over the reflective layer, the plurality of pixel walls associated with an electrowetting pixel, wherein a portion of the reflective layer extends under a first pixel wall of the plurality of pixel walls to overlie the silicon semiconductor layer.

14. The electrowetting display device of claim 13, further comprising:
 a barrier layer over the reflective layer; and
 a hydrophobic layer on the barrier layer, wherein the plurality of pixel walls are formed on the hydrophobic layer.

15. The electrowetting display device of claim 13, wherein the reflective layer extends over the organic layer to overlie a length of the silicon semiconductor layer.

16. The electrowetting display device of claim 13, wherein the first pixel wall is aligned directly over the silicon semiconductor layer.

17. The electrowetting display device of claim 13, wherein the organic layer forms a grid over the first support plate.

18. The electrowetting display device of claim 17, wherein the plurality of pixel walls are directly over the grid formed by the organic layer.

19. The electrowetting display device of claim 13, wherein the reflective layer extends over at least 140% of a length of the silicon semiconductor layer.

20. The electrowetting display device of claim 13, wherein the silicon semiconductor layer has a length between 3.0 micrometers and 20.0 micrometers, and the organic layer has a thickness of 1.0 micrometer to 3.0 micrometers, wherein the reflective layer extends at least 100% of the length of the silicon semiconductor layer.

* * * * *